(12) United States Patent
Scrudato et al.

(10) Patent No.: US 7,867,910 B2
(45) Date of Patent: Jan. 11, 2011

(54) METHOD OF ACCESSING SEMICONDUCTOR CIRCUITS FROM THE BACKSIDE USING ION-BEAM AND GAS-ETCH

(75) Inventors: Carmelo F. Scrudato, Ossining, NY (US); George Y. Gu, Burlington, MA (US); Loren L. Hahn, Cedar Creek, TX (US); Steven B. Herschbein, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 12/136,336

(22) Filed: Jun. 10, 2008

(65) Prior Publication Data

US 2009/0302431 A1 Dec. 10, 2009

(51) Int. Cl.
*H01L 21/311* (2006.01)

(52) U.S. Cl. ............... 438/700; 438/689; 257/E21.219

(58) Field of Classification Search ................ 438/689, 438/700, 713, 701; 257/E21.219
See application file for complete search history.

(56) References Cited

U.S. PATENT DOCUMENTS

2006/0030160 A1* 2/2006 Kane et al. ............... 438/710

OTHER PUBLICATIONS

Harriott, "Focused-Ion-Beam-Induced Gas Etching," Jpn.J. Appl. Phys., 33, 1994, pp. 7094-7098.*

* cited by examiner

*Primary Examiner*—Asok K Sarkar
*Assistant Examiner*—Julia Slutsker
(74) *Attorney, Agent, or Firm*—Ian McKinnon; Roberts Klotkowski Safran & Cole, P.C.

(57) ABSTRACT

The invention generally relates to semiconductor device processing, and more particularly to methods of accessing semiconductor circuits from the backside using ion-beam and gas-etch to mill deep vias through full-thickness silicon. A method includes creating a pocket in a material to be etched, and performing an isotropic etch of the material by flowing a reactive gas into the pocket and directing a focused ion beam into the pocket.

15 Claims, 8 Drawing Sheets

METHOD OF ACCESSING SEMICONDUCTOR CIRCUITS FROM THE BACKSIDE USING ION-BEAM AND GAS-ETCH

FIELD OF THE INVENTION

The invention generally relates to semiconductor device processing, and more particularly to methods of accessing semiconductor circuits from the backside using ion-beam and gas-etch to mill deep vias through full-thickness silicon.

BACKGROUND

Circuit editing is a known process in which a modification is made to existing chip wiring to change the circuit functionality. Circuit editing may comprise, for example, breaking a connection between circuit portions (e.g., etching a gap into an existing wire), and creating a connection between circuit portions (e.g., depositing metal to form a new wire).

The circuit to be edited normally resides in a very small thickness of silicon at an upper side of a chip. However, because the upper side of the chip is covered with other features (e.g., C4 and BGA solder connections, etc.), the circuit to be edited is normally accessed through the backside of the chip. One conventional method includes removing a lid (e.g., heat spreader) from the backside of the chip, mechanically milling a substantial portion of the backside of the silicon die (e.g., backside thinning), and then forming a hole in the remaining silicon die over the portion of the circuit to be edited. At this point, the circuit is normally edited using a focused ion beam (FIB) process.

FIB is generally considered to be a sputtering process. Accelerated ions (e.g., gallium ions) of an ion beam strike a surface, knocking off material of the surface. Depending on what the beam hits, there is a certain yield (e.g., how many secondary particles are removed per primary beam ion). The yield is dependent on beam scan parameters, and is complicated by a competing phenomenon known as redeposition, in which some of the sputtered material lands on the sidewalls and re-attaches to the surface. In addition to circuit editing, FIB can also be used for milling (e.g., removing bulk material, such as silicon, etc.). However, FIB alone is unsatisfactory for milling since its mill rate quickly goes to zero in a deepening pit as redeposition equals sputtering.

Gas assisted etching (GAE) is a milling method in which FIB is used in conjunction with a reactive gas. In GAE processes, a small nozzle is placed above the chip surface and directs a small flow of a reactive gas (e.g., xenon difluoride ($XeF_2$)) onto the surface to be milled (e.g., silicon, silicon dioxide, etc.). The atmosphere around the surface is held at a vacuum to remove constituents during the GAE process. Despite this vacuum, however, some of the flowing gas adsorbs to the surface a few monolayers thick. Energy, in the form of phonons (vibration) and secondary electrons from the ion beam striking the surface in the immediate vicinity, cracks the gas. In this beam driven decomposition reaction, the Xe is liberated, leaving a reactive specie of fluorine. The fluorine reacts with silicon products producing a volatile fluoride compound and clean removal of material via the vacuum. With little resulting redeposition, the process continues unimpeded, and can etch into the surface. GAE produces a beam directed etching, whereby a localized plasma/RIE-like etch process takes place substantially only where the beam is patterned (e.g., strikes the surface). Put another way, GAE produces an anisotropic etch (e.g., a vertical etch).

One disadvantage of GAE is that the reaction is limited by physics-based considerations. For example, too much ion beam energy will simply liberate the weakly bonded gas from the surface, resulting in reduced or no chemical reaction (e.g., reduced or no material removal). This is known as gas depletion mode, and more resembles a straight sputtering process. Accordingly, GAE processes are most typically used for small, precision mills of relatively small depth.

Bulk trenching (also referred to as high flow GAE) is a specialized form of GAE designed to clear large areas of backside silicon. Like GAE, bulk trenching is performed using reactive gas (e.g., $XeF_2$) and a directed ion beam in the presence of a vacuum. Unlike GAE, bulk trenching utilizes higher partial pressures of reactive gas (e.g., $XeF_2$) which results in silicon removal dominated more by a spontaneous contact reaction than by beam driven decomposition. The additional spontaneous component results in a semi-anisotropic etch (e.g., a substantially vertical etch).

The higher partial pressures utilized in bulk trenching are typically provided by employing a different type of nozzle to deliver the reactive gas. Such nozzles commonly have a large cylindrical opening at the tip, which the ion beam passes through. This allows the nozzle to be centered directly over the trench site, and helps to retain and concentrate the gas therein. Unfortunately, though, even the spontaneous reaction rate of bulk trenching is somewhat self limiting in that it slows down quickly as etching depth increases, which is why bulk trenching is considered as being semi-anisotropic.

In light of these conventional methods, standard practice for backside circuit editing involves mechanically thinning (e.g., grinding and polishing) the backside of the silicon chip (which typically starts at about 750 µm thick) down to around 100 µm thick or less, prior to placing the chip in the FIB. Subsequently, a bulk trenching process is applied to desired area(s) of the thinned chip to expose portions of the circuit for editing. One example of a bulk trenching process uses a beam current of around 20 nanoamps, an ion beam scan area of around 200 µm×200 µm, and the high flow nozzle for 25-30 minutes to mill through about 100 µm of silicon to the underside of the active devices.

A problem with this standard practice, however, is the high incidence of chip cracking. Most modern integrated circuits are C4 (e.g., controlled collapse chip connection) mounted on organic substrates to reduce cost. Mismatch of shrinkage and coefficients of thermal expansion (CTE) between the chip and the substrate causes large stresses to develop in the chip. For example, on large area chips, the CTE mismatch can cause the chip to camber (e.g., physically deflect from a planar configuration) by as much as 100 µm as the chip cools down to room temperature after the C4 solder attach process.

The aforementioned backside thinning process is typically performed using a milling machine and polishing process, and typically removes up to 675 µm of silicon from the backside of the chip (e.g., from a thickness of 775 µm to a thickness of 100 µm). However, due to the CTE induced stress in the chip, the chip often cracks during the backside thinning, which renders the chip unusable. As such, existing methods of mechanical milling prior to bulk trenching are expensive, time consuming, and generally incompatible with highly stressed silicon on organic substrates.

Accordingly, there exists a need in the art to overcome the deficiencies and limitations described hereinabove.

SUMMARY

In a first aspect of the invention, there is a method comprising creating a pocket in a material to be etched, and performing an isotropic etch of the material by flowing a reactive gas into the pocket and directing a focused ion beam into the pocket.

In another aspect of the invention, there is a method comprising creating a concentrated pocket of reactive gas in a material, wherein some of the reactive gas adsorbs onto a surface of the material. The method also includes isotropically etching the material by impacting the adsorbed reactive gas with a focused ion beam, wherein the focused ion beam moves along a predefined path in a predefined scan area.

In another aspect of the invention, there is a method comprising substantially simultaneously forming plural circuit edit trenches through a backside of an integrated circuit using a high flow gas assisted etch (GAE) process.

In an even further aspect of the invention, there is a semiconductor structure, comprising a circuit arranged between a carrier structure and a silicon layer, the silicon layer having a backside. A trench formed in the silicon layer from the backside toward the circuit. The trench comprises a bowl adjacent the backside and at least one cone extending from the bowl toward the circuit. The bowl has an upper diameter of at least 1000 μm and the bowl has a height of at least 100 μm.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor device processing, and more particularly to methods of accessing semiconductor circuits from the backside using ion-beam and gas-etch to mill deep vias through full-thickness silicon. Embodiments of the invention provide a highly accelerated method of gas assisted trenching that enables full thickness die processing without mechanical pre-milling. More specifically, in embodiments of the invention, a mega-via (also referred to as a mega-trench) is formed in the backside of a chip to expose a portion of the circuit for editing without the use of mechanical pre-milling (e.g., mechanical thinning). By eliminating mechanical pre-milling of the chip, implementations of the invention avoid chip cracking that results from mechanical thinning of stressed chips. Accordingly, embodiments of the invention provide for efficient and fast methods for backside circuit editing of modern integrated circuits mounted on organic substrates.

Figure 1:
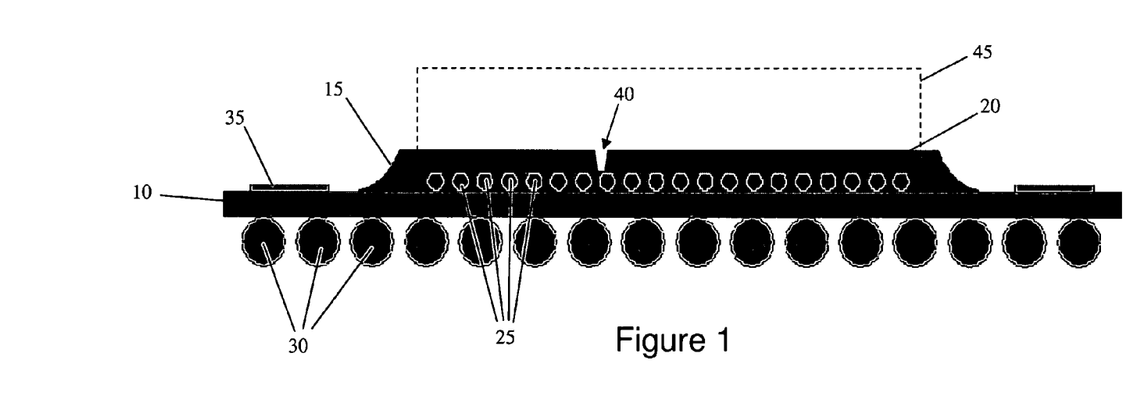
FIG. 1 shows a mechanically thinned integrated circuit with a trench.

FIG. 1 shows a mechanically thinned semiconductor device with a trench formed in its backside. The device comprises, for example, an organic carrier 10, underfill 15, silicon 20, circuit 25 in the silicon 20, and solder 30 (e.g., BGA) on the front side of the device, all of which are known such that further explanation is not believed necessary. Reference number 35 represents the remainder of a lid (e.g., heat spreader) that is removed from the backside of the chip to provide access to the silicon 20. Prior to forming a trench 40 to expose a portion of the circuit 25 for editing, a portion of the silicon represented by dashed line 45 is removed via mechanical thinning (e.g., grinding and polishing).

Figure 2:
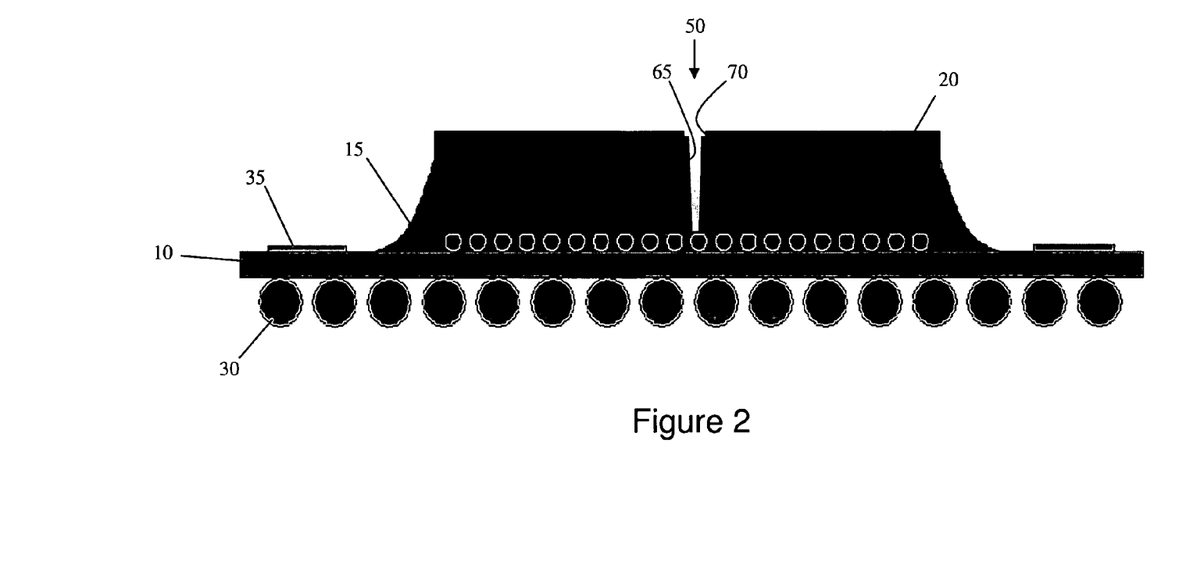
FIG. 2 shows an integrated circuit with a trench.

FIG. 2 shows a semiconductor device similar to that of FIG. 1, in which like reference numerals represent similar features. In FIG. 2, however, the portion 45 of the backside of the silicon 20 is not removed by mechanical thinning. Instead, the silicon 20 remains at full thickness after removal of the lid 30. Trench 50 is formed in the silicon 20 using a high flow gas assisted etching (GAE) process.

In the specific example depicted in FIG. 2, the trench 50 is formed through the entire thickness (e.g., 775 μm) of the silicon 20 using a semi-anisotropic high flow GAE process in which the dimensions (e.g., length and width) of the ion beam scan area (see FIG. 3) are both set at about 200 μm. The process takes about eight to ten hours to etch through the entire thickness (e.g., 775 μm). The resulting trench 50 has dimensions of about 200 μm by 200 μm wide at its top by 775 μm deep, with substantially straight tapering sidewalls 65 and an area of surface damage 70. The cross section of the trench 50 along the long axis of the trench 50 resembles the shape of a box (e.g., square) (see FIG. 3). Moreover, the surface damage 70 extends only to a depth of about 15 μm or 20 μm into the silicon 20. The steep sidewalls 65 produce a narrow opening 75 at the bottom of the trench 50, which makes subsequent circuit editing difficult.

Figure 3:
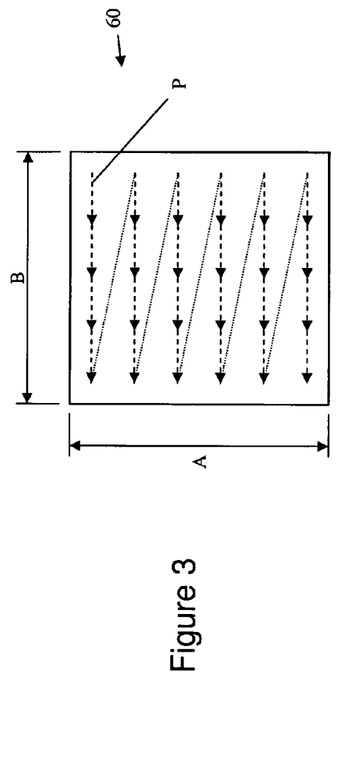
FIG. 3 shows an ion beam scan area.

FIG. 3 shows an exemplary scan area 60 (also referred to as a box) for the ion beam used to create the trench 50 on FIG. 2. In other words, the box 60 represents the area of the surface of the silicon 20 at which the ion beam is be directed. The box 60 has a rectangular shape having width A and length B in which the ion beam follows either a raster or serpentine path P when impacting the surface of the silicon 20.

Figure 4:
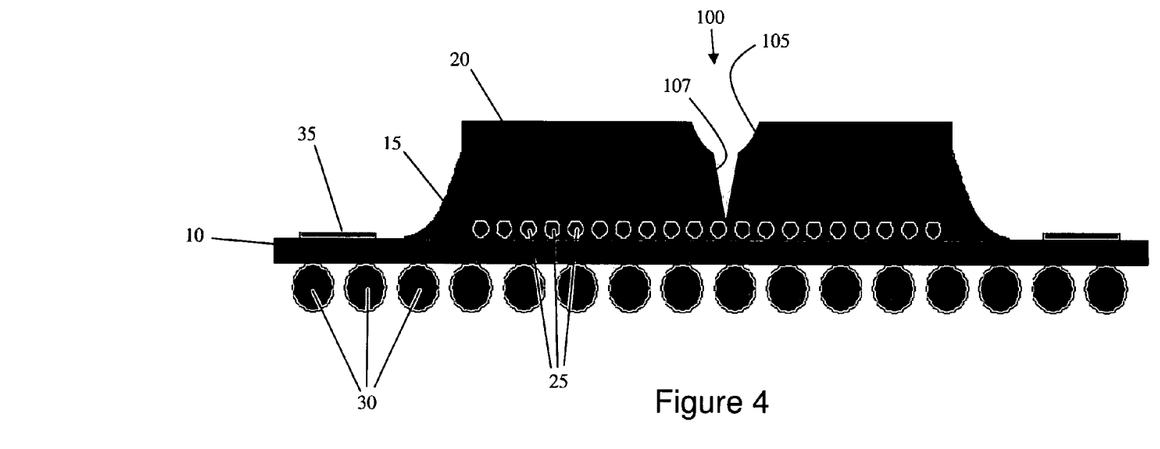
FIGS. 4-11 show exemplary embodiments of a mega-trench according to aspects of the invention.

FIG. 4 shows a semiconductor device having a mega-trench 100 (or mega-via) produced in accordance with aspects of the invention. In embodiments, the mega-trench 100 comprises a bowl 105 and a cone 107. As can be seen by comparing FIGS. 2 and 4, the bowl 105 is considerably wider and deeper than the surface damage 70 of trench 50. Also, the wall of cone 107 is sloped less steep than sidewalls 65 of trench 50. Accordingly, the mega-trench 100 results in a much larger volume of removed silicon 20, which makes it easier to perform circuit edits at the base of the mega-trench 100.

In embodiments of the invention, the mega-trench 100 is formed using a high flow GAE process in which etching occurs isotropically, e.g., both horizontally as well as vertically. In particular embodiments of the invention, the shape of the mega-trench 100 results very unexpectedly from using a smaller ion beam scan area when compared to the box 60 used to produce trench 50 of FIG. 2. This is counter-intuitive because one would normally think that a smaller ion beam scan area would produce a smaller trench. However, in processes according to aspects of the invention, the use of a smaller scan area has been found to produce a larger trench.

For example, conventional wisdom holds that in order to decrease the sidewall slope of a trench while at the same time increase the etch rate, one would need to (1) increase the ion beam scan area and (2) increase the beam current (e.g., energy). However, quite counter-intuitively, the inventors have found that by decreasing the ion beam scan area without significantly increasing the beam energy produces an unexpected isotropic etching condition that forms the mega-trench 100 much larger and much faster than the smaller semi-anisotropically etched trench 50.

In embodiments of the invention, the use of a smaller ion beam scan area causes a higher ion beam current density to be confined to an initially smaller hole (e.g., pocket) in the material (e.g., silicon), which results in a cascading effect that liberates and traps more secondaries and phonons per primary beam ion. This high energy concentration results in a much greater decomposition of the tightly confined high partial pressure gas pocket, which provides an increase in the activated fluorine species that etches in an isotropic manner (e.g., horizontally and vertically) to create the bowl 105. As the etch gas becomes sufficiently depleted at the base of the bowl 105, the physics of the etch change to form the resulting cone 107.

Figure 5:
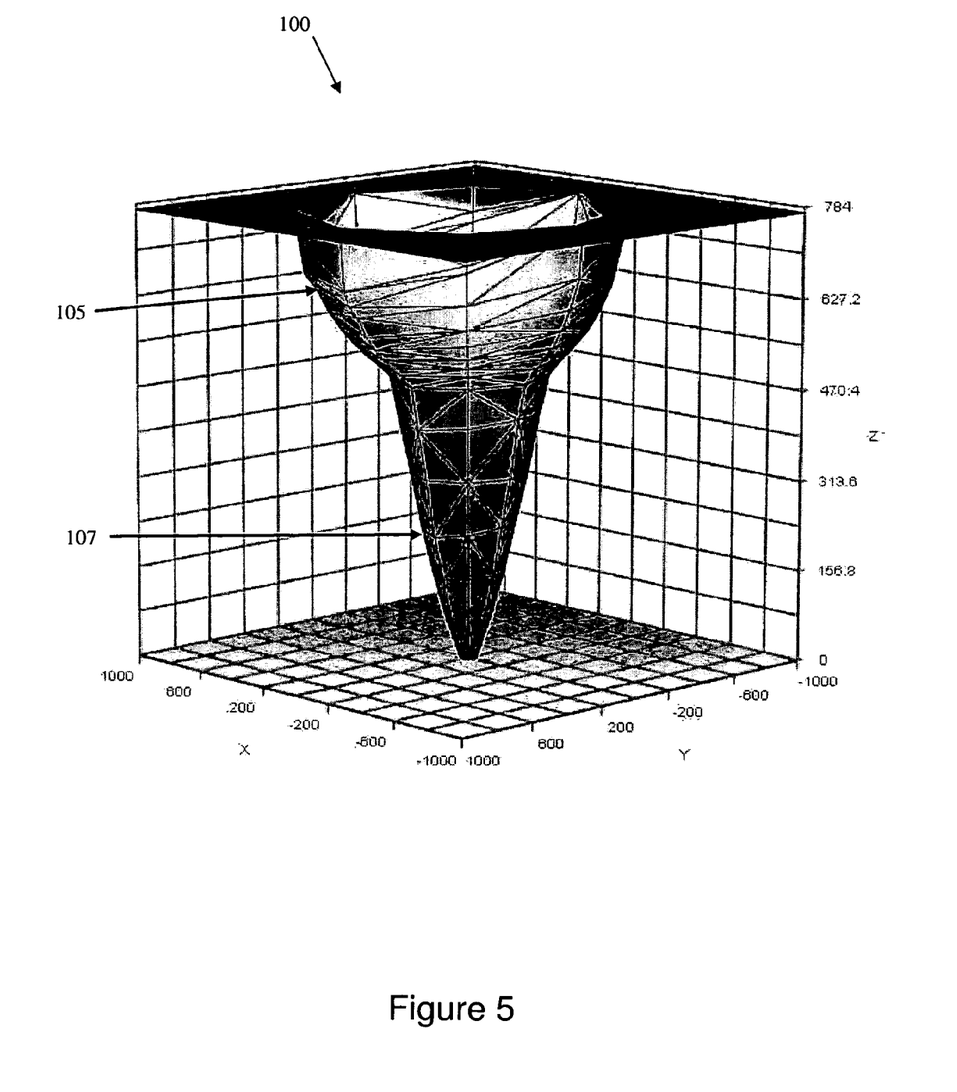
Figure 6:
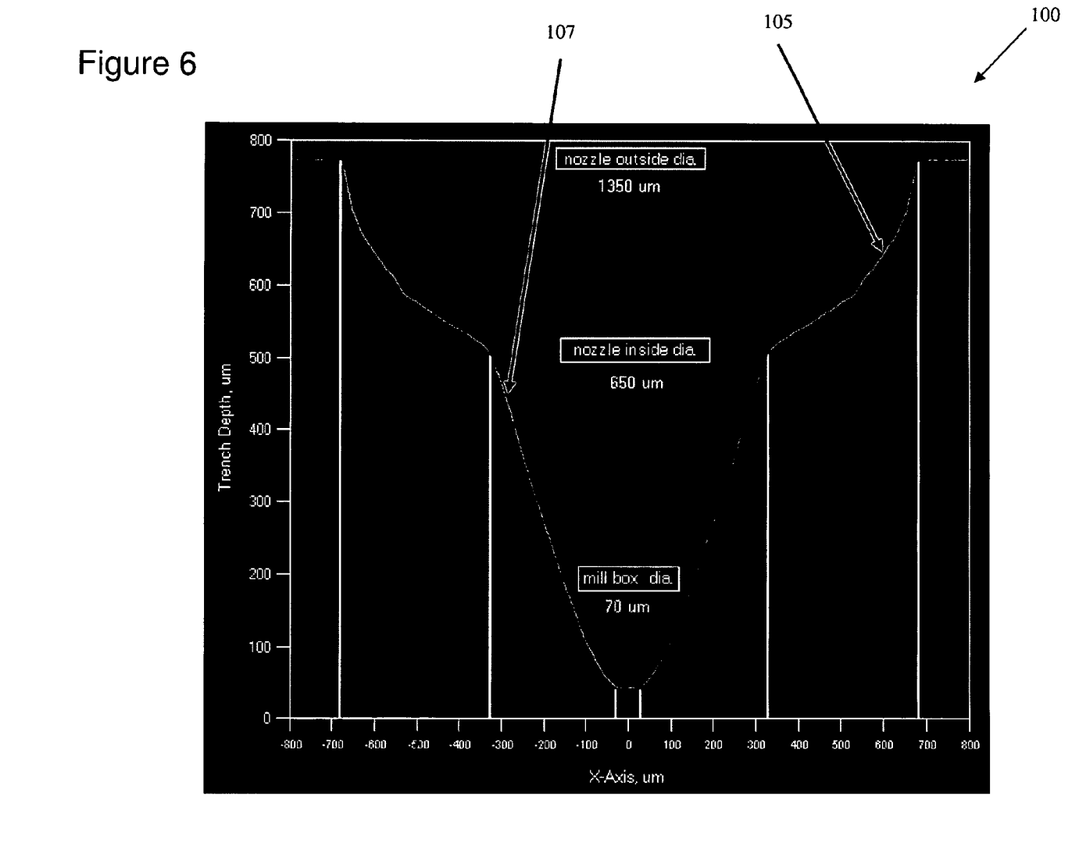

FIGS. 5 and 6 show exemplary profiles of a mega-trench 100 formed in accordance with aspects of the invention. As seen in these figures, the mega-trench has a depth of about 775 μm. The bowl 105 has a diameter at its upper side of about 1350 μm, a diameter at its lower end of about 650 μm, and a height of about 275 μm. The cone 107 has an upper diameter of about 650 μm, a lower diameter of about 70 μm, and a height of about 500 μm. The bowl 105 and cone 107 of the mega-trench 100 have generally circular cross sections along the longitudinal axis of the mega-trench 100, instead of having substantially rectangular cross section corresponding to the rectangular shape of the scan area. Although specific values of dimensions of features of the mega-trench 100 are disclosed above, the invention is not limited to these values. Instead, in embodiments, the processes of the invention can be used to attain a wide range of sizes of mega-trench 100, including but not limited to, an upper diameter of the bowl 105 being at least 1000 μm and a height of the bowl 105 being at least 100 μm.

The isotropic etch process of embodiments of the invention allows a relatively large amount of material (e.g., silicon) to be removed in a relatively low amount of time. For example, the inventive process used to create the exemplary mega-trench 100 depicted in FIGS. 4-6 removes approximately 300 million $\mu m^3$ of material (e.g., silicon) and reaches full depth (e.g., 775 μm) in about 26 minutes. Comparing this to the trench 50 shown in FIG. 2, in which about 36 million $\mu m^3$ of material is removed in about 8 to 10 hours, one can see that the inventive process removes much more material in much less time than previously known processes. Put another way, the average removal rate of the inventive process used to create the mega-trench 100 (e.g., FIGS. 4-6) is about 11.5 million $\mu m^3$ per minute, which is about 35 times greater than the removal rate of the conventional processes used to create trench 50 (e.g., FIG. 2).

The removal rate of the material in the exemplary inventive process is unexpected because the ion beam scan area used to create the mega-trench 100 (e.g., FIGS. 4-6) is smaller than the ion beam scan area used to create the trench 50 (e.g., FIG. 2). For example, in a particular exemplary embodiment, the scan area 60 used to create the mega-trench 100 has A and B dimensions of about 60 μm, whereas the scan area 60 used to create the trench 50 has A and B dimensions of about 200 μm, with all other parameters being substantially the same. Thus, in this particular exemplary embodiment, the smaller ion beam scan area of the inventive process creates a much greater rate of material removal.

Figure 7:
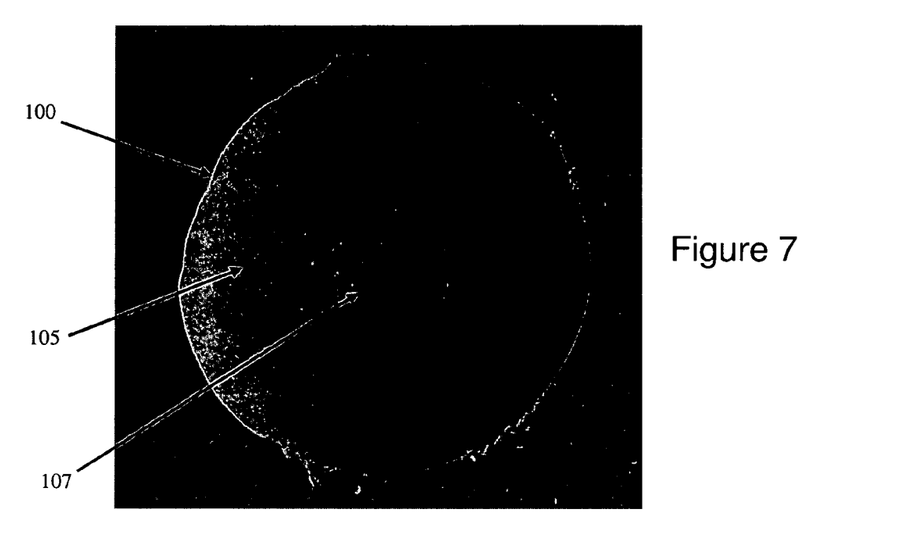
Figure 8:
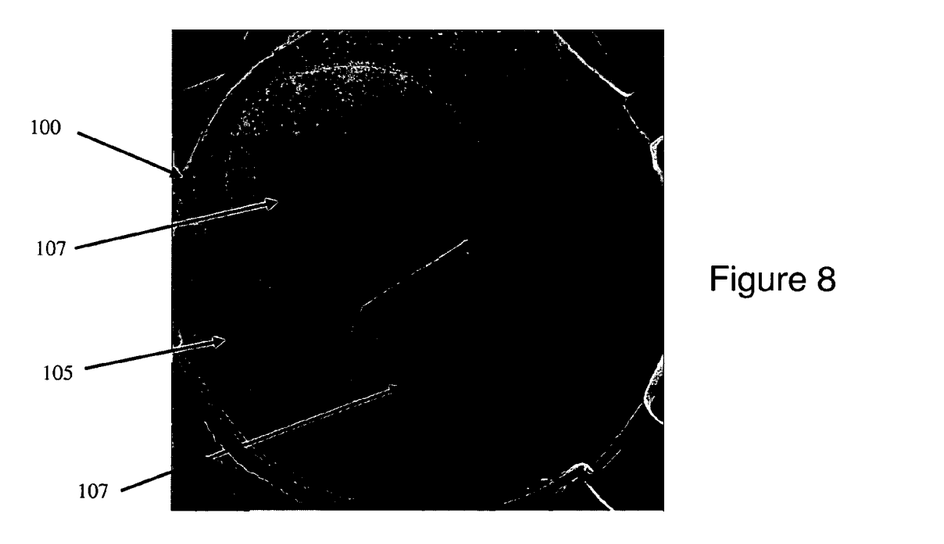
Figure 9:
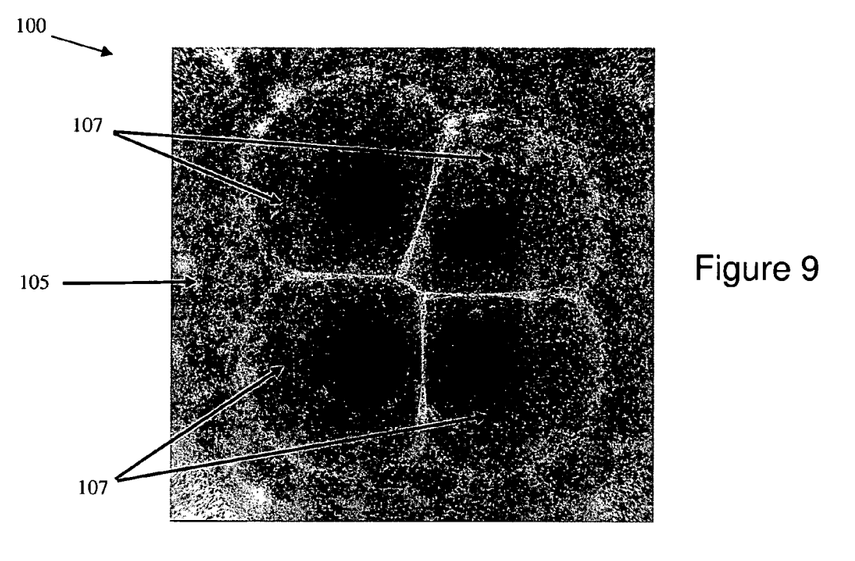
Figure 10:
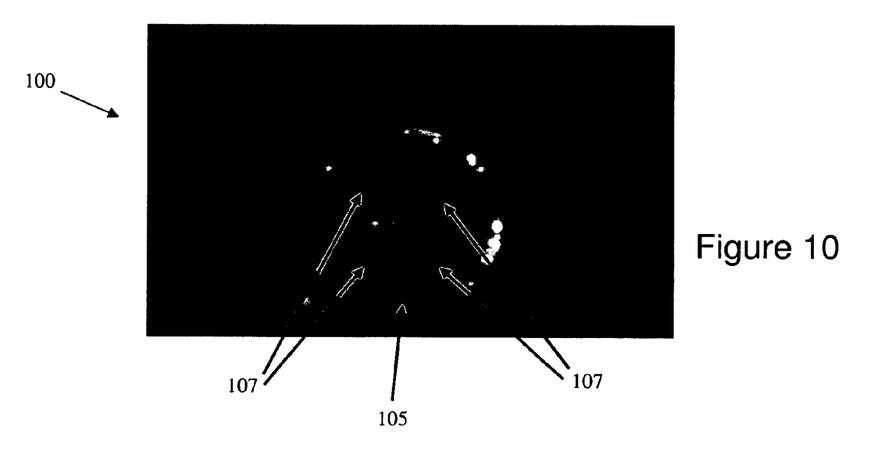

FIGS. 7-10 show plan views (e.g., top down views) of various mega-trenches 100 made using processes in accordance with aspects of the invention. For example, FIG. 7 shows the delineation between the bowl 105 and the cone 107. FIG. 8 shows two cones 107 extending from a single bowl 105. FIGS. 9 and 10 show, respectively, microscopic and macroscopic views of a structure comprising four cones 107 extending from a single bowl 105. These structures may be created using processes described herein to provide access to a single portion, or plural different portions, of the circuit to perform circuit edits.

Figure 11:
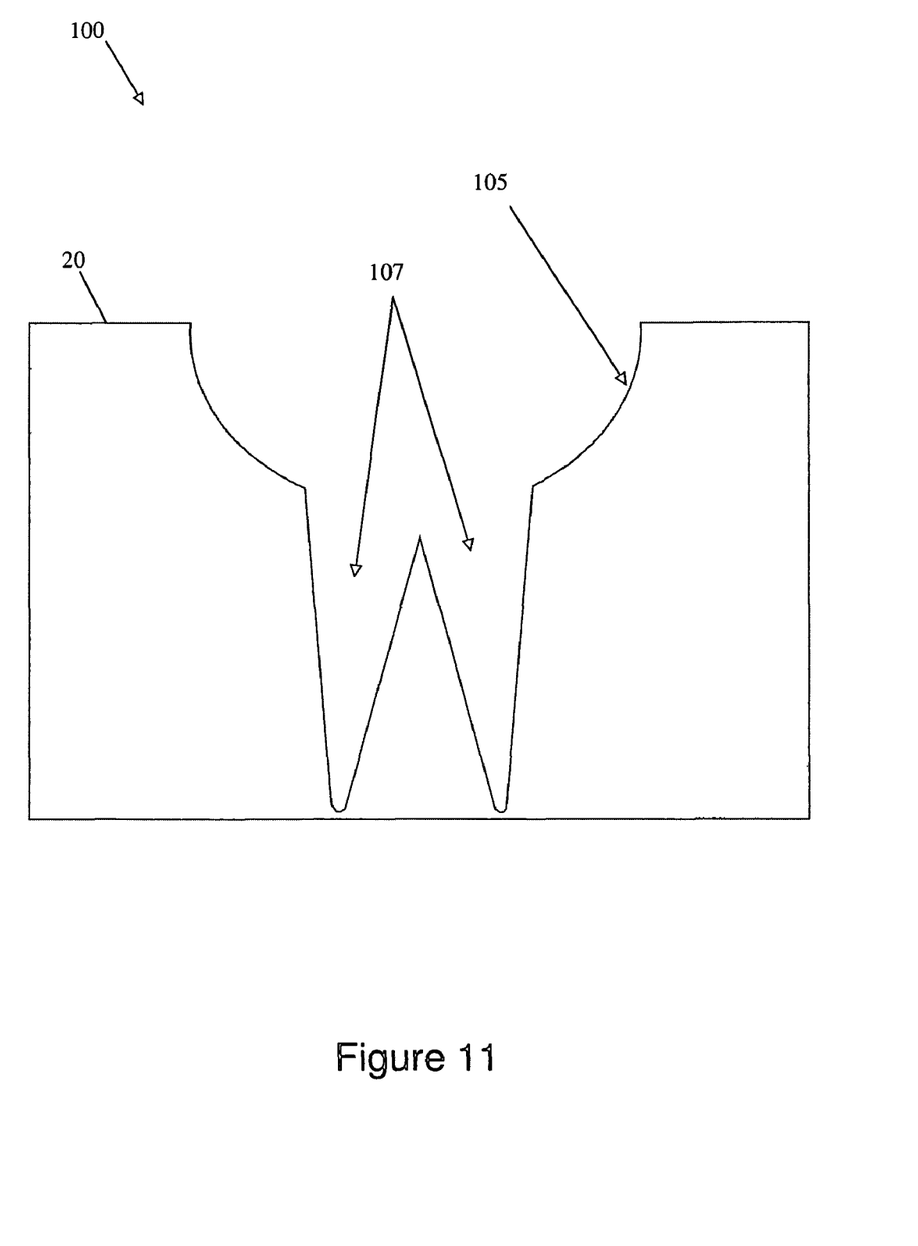

FIG. 11 shows a diagrammatic profile of an exemplary two-cone mega-trench 100 according to aspects of the invention (e.g., similar to that shown in FIG. 8). The two cones 107 are formed using two spatially offset ion beam scan areas in a single high flow GAE process, as described in greater detail below. In this manner, the two cones 107 are formed substantially simultaneously (e.g., in parallel) during a single high flow GAE process.

Processes of the Invention

Figure 12:
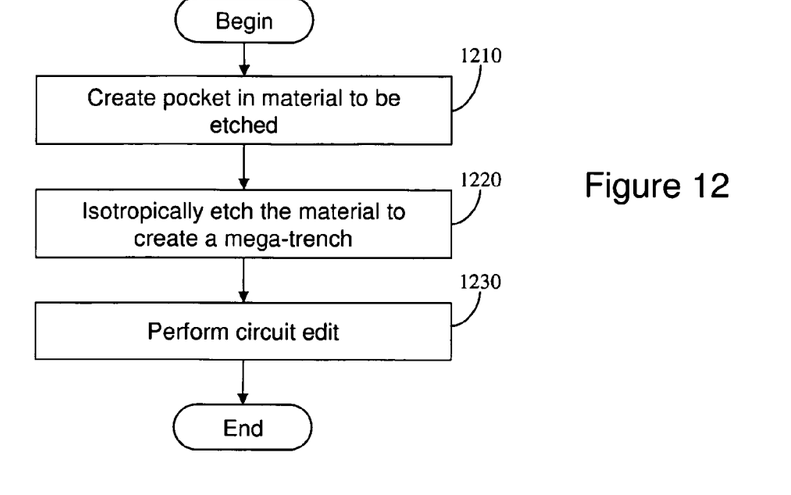
FIGS. 12 and 13 show flow diagrams of processes in accordance with aspects of the invention.
Figure 13:
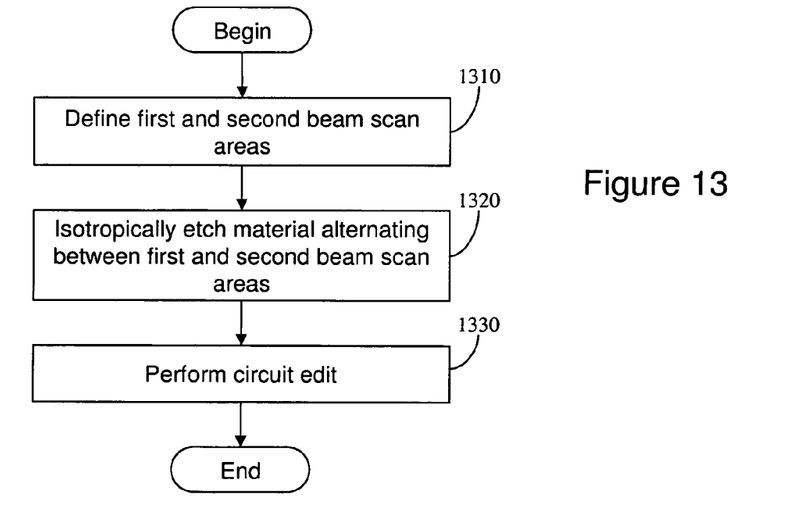

FIGS. 12 and 13 are flow diagrams implementing steps in accordance with aspects of the invention. The flow diagrams may equally represent a high-level block diagram of the invention. The steps of the flow diagrams may be controlled and executed from a server, in a client-server relationship, by computing devices in an ad hoc network, or they may run on a user workstation with operative information conveyed to the user workstation. Additionally, the invention can be controlled using an entirely hardware embodiment, an entirely software embodiment or an embodiment containing both hardware and software elements. In an embodiment, the software elements include firmware, resident software, microcode, etc.

Furthermore, the invention can be controlled by a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

More specifically, FIG. 12 shows a flow diagram depicting control steps of a method for accessing semiconductor circuits from the backside using ion-beam and gas-etch to mill deep vias through full-thickness silicon according to aspects of the invention. At step 1210, a pocket is created in the surface of the material to be etched (e.g., backside silicon of an integrated circuit chip). In embodiments, this comprises impinging a flow of reactive gas onto the surface of the material in the presence of a relative vacuum atmosphere, and then directing a focused ion beam at the surface where the reactive gas is impinging. The gas may comprise, for example, $XeF_2$, or other gas suitable for high flow GAE processes. More specifically, step 1210 may comprise causing at least some of the reactive gas to adsorb to the surface of the material. In embodiments, the adsorption is a few monolayers thick.

Still referring to step 1210, the focused ion beam may comprise, for example, gallium (Ga+), or other ion beam suitable for high flow GAE processes. The impact of the ions (e.g., Ga+) onto the adsorbed monolayers releases energy in the form of phonons and secondary electrons, which decomposes the adsorbed reactive gas. For example, in embodiments, the impact of the Ga+ ions liberates the Xe from the adsorbed $XeF_2$, leaving a reactive species of fluorine. The fluorine reacts with silicon products producing a volatile fluoride compound and clean removal of material via the vacuum.

Still referring to step 1210, by utilizing a relatively small ion beam scan area (e.g., scan area, box, etc.), the initial removal of material (e.g., silicon) creates a small pocket in the material. In embodiments, the ion beam scan area (e.g., scan area, box, etc.) has a length and width of about 60 μm; however, the invention is not limited to these dimensions, and any suitable dimension that results in the desired isotropic etching can be used.

At step 1220, the material is isotropically etched to create a mega-trench. In embodiments, this comprises continuing the high flow GAE process that was initiated in step 1210. More specifically, the reactive gas is impinged into the pocket that was formed in step 1210, and the ion beam is repeatedly directed along the previously defined scan area.

By appropriately selecting the reactive gas, the ion of the ion beam, and the size of the scan area, a relatively high ion beam current density is confined to the pocket formed in step 1210, which results in a cascading effect that liberates and traps more secondaries and phonons per primary beam ion. This high energy concentration results in a much greater decomposition of the tightly confined high partial pressure gas pocket, which provides an increase in the activated gas species (e.g., fluorine) that etches the material in an isotropic manner (e.g., horizontally and vertically).

In embodiments, the combination of steps 1210 and 1220 produce a mega-trench, such as that described above with respect to FIGS. 4-11. In particular embodiments, steps 1210 and 1220 produce a mega-trench having a bowl at its top portion and a cone extending form the bowl deeper into the material. At step 1230, the mega-trench can subsequently be used, for example, to perform an FIB edit of a circuit held in the material.

FIG. 13 shows a flow diagram depicting control steps of a method for forming plural mega-trenches substantially simultaneously according to aspects of the invention. At step 1310, first and second scan areas for a high flow GAE process are defined. This may be performed in a known manner. In embodiments, the first and second scan areas are about 60 μm by about 60 μm, although the invention is not limited to these values. In embodiments, the scan areas are spatially offset from one another. In particular embodiment, the distance of the offset is about 400 μm, although the invention is not limited to this value and any suitable offset may be used.

At step 1320, a high flow GAE process is performed substantially simultaneously on the first and second scan areas. In embodiments, this comprises impinging a reactive gas onto the material surface at the scan areas and directing an ion beam into the scan areas, similar to steps 1210 and 1220 described above.

However, unlike steps 1210 and 1220, where the ion beam is repeatedly scanned along the same scan area (e.g., tens of thousands of times), in step 1320 the ion beam alternates scanning between the two scan areas. That is, the ion beam is scanned once along the path of the first scan area, then scanned once along the path of the second scan area, then back to the first area, etc., in a repeating and alternating fashion. Instead of performing all of the scans (e.g., tens of thousands) on the first area before moving the second area, step 1320 alternates scans between the two areas.

Due to the relatively short time involved in each scan (e.g., nanoseconds), the isotropic etch of the material associated with the first and second scan areas occurs substantially simultaneously. As a result, a mega-trench having a single bowl and plural cones is created (similar, for example, to those shown in FIGS. 8-11). In this manner, plural edit sites having the benefits of the invention may be created substantially simultaneously. At step 1330, the plural edit sites of the mega-trench can subsequently be used, for example, to perform an FIB edit of a circuit held in the material.

As described herein, embodiments of the invention provide improvements over conventional methods for accessing circuits for backside editing. For example, implementations of the invention eliminate the backside grinding/polishing tools and their related costs, and speed up sample preparation time for backside FIB edits from one working day to less than thirty minutes. Also, implementations of the invention are safer to the chip than mechanical backside thinning, since stress induced fractures and cracks are avoided. Moreover, embodiments of the invention make it possible to FIB edit temporary chip attach (TCA) mounted chips and/or cambered or bowed chips on flexible organic substrates. Furthermore, implementations of the invention speed up the repackaging process after an FIB edit, and preserve overall global thermal characteristics of the sample. Lastly, implementations of the invention greatly improve turnaround time from backside FIB edits from three or four days to one day.

The invention is not limited to use with backside circuit editing, and may be used in other applications where non-mechanical removal of semiconductor material is desired. For example, implementations of the invention may be used to create through silicon via (TSV) contacts in stacked chips. Compared to two dimensional multi-chip modules, three-dimensional stacking of chips increases interconnection density, increases speed, decreases wire lengths, saves space, and reduces system thermal output. Embodiments of the invention may be used to form features (e.g., vias) in such chips.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for creating a trench that can be used for backside editing of an integrated circuit, comprising:
   creating a pocket in a material of the integrated circuit; and
   performing an isotropic etch of the material by flowing a reactive gas into the pocket and directing a focused ion beam into the pocket,
   wherein the isotropic etch creates a bowl and at least one cone in the material by utilizing a relatively small ion beam scan area resulting in larger sizes of the bowl and at least one cone.

2. The method of claim 1, wherein the bowl is arranged at an upper portion of the material, and the at least one cone extends downward from the bowl into a lower portion of the material.

3. The method of claim 2, wherein the bowl has an upper diameter of at least 1000 μm and a height of at least 100 μm.

4. The method of claim 1, wherein the at least one cone comprises at least two cones extending from the bowl.

5. The method of claim 1, wherein the material comprises backside silicon of the integrated circuit.

6. The method of claim 1, further comprising editing the integrated circuit through the bowl and the at least one cone.

7. A method, comprising:
   creating a concentrated pocket of reactive gas in a material, wherein some of the reactive gas adsorbs onto a surface of the material; and
   isotropically etching the material by impacting the adsorbed reactive gas with a focused ion beam, wherein the focused ion beam moves along a predefined path in a predefined scan area
   wherein the isotropic etching creates a trench having an upper bowl and a lower cone extending from the upper bowl by utilizing a relatively small ion bean scan area resulting in a larger size of the trench.

8. The method of claim 7, wherein the isotropic etching etches the material horizontally and vertically.

9. The method of claim 7, wherein:
   the material is backside silicon of an integrated circuit,
   the upper bowl has an etched upper diameter of at least 1000 μm, and
   the upper bowl has an etched height of at least 100 μm.

10. A method for substantially simultaneously forming plural circuit edit trenches through a backside of an integrated circuit using a high flow gas assisted etch (GAE) process, the method comprising: defining first and second beam scan areas in a material, and performing the high flow GAE process to cause isotropic etching of the material by alternating a focused ion beam scanning between the first and the second beam scan areas, wherein the isotropic etch creates a bowl and at least one cone in the material by utilizing a relatively small the first and the second beam scan areas resulting in larger sizes of the bowl and at least one cone.

11. The method of claim 10, wherein the first and second scan areas are spatially offset.

12. The method of claim 10, wherein the first and second scan areas correspond to the plural circuit edit trenches.

13. The method of claim 10, wherein the first and second scan areas each have a length and a width of about 60 μm.

14. The method of claim 10, wherein the bowl has an upper diameter of at least 1000 μm and the bowl has a height of at least 100 μm.

15. The method of claim 1, wherein the bowl and at least one cone are created by directing the focused ion beam along the previously defined small ion beam scan area.

* * * * *